United States Patent [19]
Lewis et al.

[11] Patent Number: 5,164,616
[45] Date of Patent: Nov. 17, 1992

[54] INTEGRATED SAMPLE AND HOLD CIRCUIT WITH FEEDBACK CIRCUIT TO INCREASE STORAGE TIME

[75] Inventors: Alan Lewis, Sunnyvale; Richard H. Bruce, Los Altos; William F. Gunning, Los Altos Hills, all of Calif.

[73] Assignee: Xerox Corporation, Stamford, Conn.

[21] Appl. No.: 459,096

[22] Filed: Dec. 29, 1989

[51] Int. Cl.$^5$ .................... G11C 27/02; H03K 5/153
[52] U.S. Cl. ........................... 307/353; 328/151
[58] Field of Search ............ 307/353, 352, 359; 328/151; 357/23.7

[56] References Cited

U.S. PATENT DOCUMENTS

| | | | |
|---|---|---|---|
| 3,516,002 | 6/1970 | Hillis | 328/151 |
| 3,551,698 | 12/1970 | Smith | 307/238 |
| 3,961,205 | 6/1976 | Kuligowski et al. | 307/261 |
| 3,996,480 | 12/1976 | Hentschel | 307/235 |
| 4,063,182 | 12/1977 | Besson | 307/353 |
| 4,068,136 | 1/1978 | Minami | 307/353 |
| 4,094,007 | 6/1978 | Minami | 365/45 |
| 4,142,117 | 2/1979 | Chang | 307/353 |
| 4,302,689 | 11/1981 | Brodie | 328/151 |
| 4,389,579 | 6/1983 | Stein | 307/353 |
| 4,393,318 | 7/1983 | Tatahashi | 307/353 |
| 4,585,956 | 4/1986 | Lie | 307/353 |
| 4,603,266 | 7/1986 | Berger | 307/353 |
| 4,783,602 | 11/1988 | Viswanathan | 387/353 |
| 4,862,016 | 8/1989 | Genrich | 307/353 |
| 4,906,871 | 3/1990 | Iida | 307/475 |
| 4,943,837 | 7/1990 | Konishi et al. | 357/23.7 |

OTHER PUBLICATIONS

European Search Report, Application No. EP90 31 4110, dated Oct. 10, 1991, with Annex dated Oct. 11, 1991.
Jung, W., "Sample-and-Hold-Verstärker in der Praxis", Elektronik, vol. 35, No. 13, Jun. 1986, pp. 106-112, with an English Translation of Excerpts from pp. 110-112.
"The Art of Electronics", Horowitz and Hill, Cambridge Univ. Press, 1980, pp. 234-236.
"Low Feedthrough Analog Switch in Sample and Hold Circuits", Electron (GB), No. 129, p. 63.
Korn, Granino A., Korn, Theresa M., *Electronic Analog Computers*, New York, McGraw-Hill, 1956 pp. 345-349.

*Primary Examiner*—William L. Sikes
*Assistant Examiner*—Toan Tran

[57] ABSTRACT

An integrated sample and hold circuit includes a capacitor that is charged through a channel, such as a first input transistor's channel. Feedback circuitry connected to the first transistor's channel leads maintains approximately zero voltage difference between the channel leads to prevent leakage current when the first transitor is turned off. Isolation circuitry, such as a second input transistor, isolates the first transistor from the input voltage while a voltage level is being stored, and the gates of both input transistors can be connected to receive the same store signal. The feedback circuitry can include a follower transistor with its gate connected to the first transistor's output lead and a first channel lead connected to the first transistor's input lead and to load circuitry that maintains current flow through the follower transistor. To ensure that it does not pass current to or from the capacitive element, the follower transistor can be an MOS device or other insulated gate transistor. The follower transistor's other channel lead can be connected to a bias voltage that, together with the current flow, keeps the follower transistor's gate and first channel lead at the stored voltage level. The load circuitry can include a transistor identical to the follower transistor, with one of its channel leads connected to the follower transistor's first channel lead and with its other channel lead and its gate lead connected to a bias voltage that maintains sufficient current flow through the follower transistor. The substrate can be an insulating material such as glass, quartz, sapphire, silicon dioxide, or silicon nitride, and the circuitry can be thin film structures, amorphous silicon, polysilicon, or single crystal devices, so that the only significant leakage path to and from the capacitive element is through the first input transistor's channel.

20 Claims, 4 Drawing Sheets

INTEGRATED SAMPLE AND HOLD CIRCUIT WITH FEEDBACK CIRCUIT TO INCREASE STORAGE TIME

BACKGROUND OF THE INVENTION

The present invention relates to a sample and hold circuit for storing an analogue voltage level. More specifically, the invention relates to a sample and hold circuit that can be integrated on a substrate.

Smith, U.S. Pat. No. 3,551,698, describes an analogue memory system that uses a capacitive element to store a signal in the form of electric charge, indicated by the voltage across the capacitive element. A follower circuit receives the voltage across the capacitor and feeds back its output to one side of the switch used to charge the capacitive element. This reduces leakage of the stored charge, so that the signal is stored for an extended time. As shown and described in relation to FIG. 1, Smith's follower circuit includes a high impedance coupling circuit, such as a MOSFET; a two-stage differential amplifier; a gain control circuit; and an output circuit. As shown and described in relation to FIG. 3, a tubular-type capacitor and a separate MOSFET are mounted on a board.

Viswanathan, U.S. Pat. No. 4,783,602, describes an integrated circuit that includes an operational transconductance amplifier (OTA) for use in sample and hold circuits, shown and described in relation to FIG. 1. When the OTA is used in a sample and hold circuit, as shown and described in relation to FIG. 2, it is on standby during the hold mode, and essentially no leakage current flows to or from the OTA, so that the output of the operational output amplifier does not change.

SUMMARY OF THE INVENTION

The present invention provides a sample and hold circuit that can be integrated onto a substrate and that includes a capacitive element, input circuitry through which the capacitive element is charged, and feedback circuitry to extend the capacitive element's storage time by preventing leakage current through the input circuitry.

One aspect of the invention is based on the recognition of a basic problem in integrating a sample and hold circuit with a capacitive element for storing a voltage level. If the input circuitry through which the capacitive element is charged includes a channel of an input transistor with a channel output lead connected to the capacitive element and a channel input lead connected to receive an input voltage signal, the channel provides a leakage path through which a stored voltage level can change. This leakage path limits the capacitive element's effective storage time.

This problem can be alleviated by providing feedback circuitry that prevents leakage current through the input transistor and that does not itself pass current to or from the capacitive element. The feedback circuitry can be connected to the channel leads of the input transistor and can operate to maintain approximately zero voltage difference between the channel leads when the channel is in its high impedance, or off, state, which in turn ensures approximately zero leakage current flow through the channel to or from the capacitive element while the input transistor is off. The feedback circuitry and input transistor can be isolated from the input voltage by isolation circuitry.

This technique leads to a further aspect of the invention, which provides simple, self-adjusting, high input impedance feedback circuitry that permits high density integration of sample and hold circuits. The feedback circuitry can include a follower transistor with its gate connected to the first input transistor's output lead and with a first one of its channel leads connected to the first input transistor's input lead and to load circuitry that maintains a current flow through the follower transistor channel. The other follower transistor channel lead can be connected to a follower bias voltage which, together with the current flow, is such that the gate and the first channel lead are both at the stored voltage level when the first input transistor and isolation circuitry are off. The follower transistor can be an insulated gate transistor, such as an MOS transistor, to ensure that it does not pass current to or from the capacitive element.

The load circuitry can include a load transistor identical to the follower transistor. The load transistor can have one of its channel leads connected to the first channel lead of the follower transistor and its gate and the other of its channel leads connected to a load bias voltage such that there is sufficient current through the follower transistor to keep the follower transistor's gate and its first channel lead at the stored voltage level.

The isolation circuitry can include a second input transistor with one of its channel leads connected to receive an input voltage signal and the other connected to the first input transistor's channel input lead. The second input transistor isolates the first input transistor from the input voltage signal so that the feedback circuitry can effectively prevent leakage current through the first input transistor's channel. The gate leads of the first and second input transistors can both be connected to receive a store signal that switches their channels between their high and low impedance states.

A closely related aspect of the invention further alleviates the problem of leakage paths by integrating the sample and hold circuit on an insulating substrate, reducing the number of leakage paths. This technique can reduce the leakage paths such that the only significant leakage path is the channel of the first input transistor, which can in turn be reduced by feedback circuitry as described above. For example, the integrated circuit can be implemented with amorphous or polysilicon thin film structures on a glass or quartz substrate or as single crystal silicon structures on an insulating substrate such as sapphire, silicon dioxide, or silicon nitride.

The following description, the drawings and the claims further set forth these and other objects, features and advantages of the invention.

DETAILED DESCRIPTION

A. Definitions

The following definitions are helpful in understanding the broad scope of the invention, and the terms defined below have the meanings indicated throughout this application, including the claims.

A "substrate" is a material on which circuitry can be formed.

An "integrated circuit" is a circuit formed on a substrate by processes such as etching and deposition.

A "lead" is a part of an electrical component at which the component connects electrically to other components.

A "line" is a simple conductive component that extends between and connects two or more leads.

A lead of a component is "connected" to a lead of another component when there is a conductive electrical connection between them through a combination of leads and lines. In an integrated circuit, leads of two components may also be "connected" by being formed as a single lead that is part of both components.

A "capacitive element" is a component that stores a voltage level by storing charge. A capacitive element has two leads.

A "transistor" is a component that has a channel that extends between and connects to two leads, and that also has a third lead for controlling the impedance of the channel. The third lead is called the "gate" and the leads connected to the channel are called the "channel leads," or, in some instances, the "source" and the "drain."

A "leakage current" is a current that occurs due to non-ideal behavior in a component.

A lead in a circuit is "at a fixed potential" if, during operation of the circuit, it is connected through a combination of leads and lines to a low impedance component that is treated as being at a fixed potential. For example, an integrated circuit typically has an external ground connection that is treated as zero potential; a lead that is connected by a combination of leads and lines to the external ground connection is at a fixed potential and, more specifically, is at ground potential.

A "thin film structure" is a structure that is formed by deposition of films on a substrate surface.

B. General Features

Figure 1:
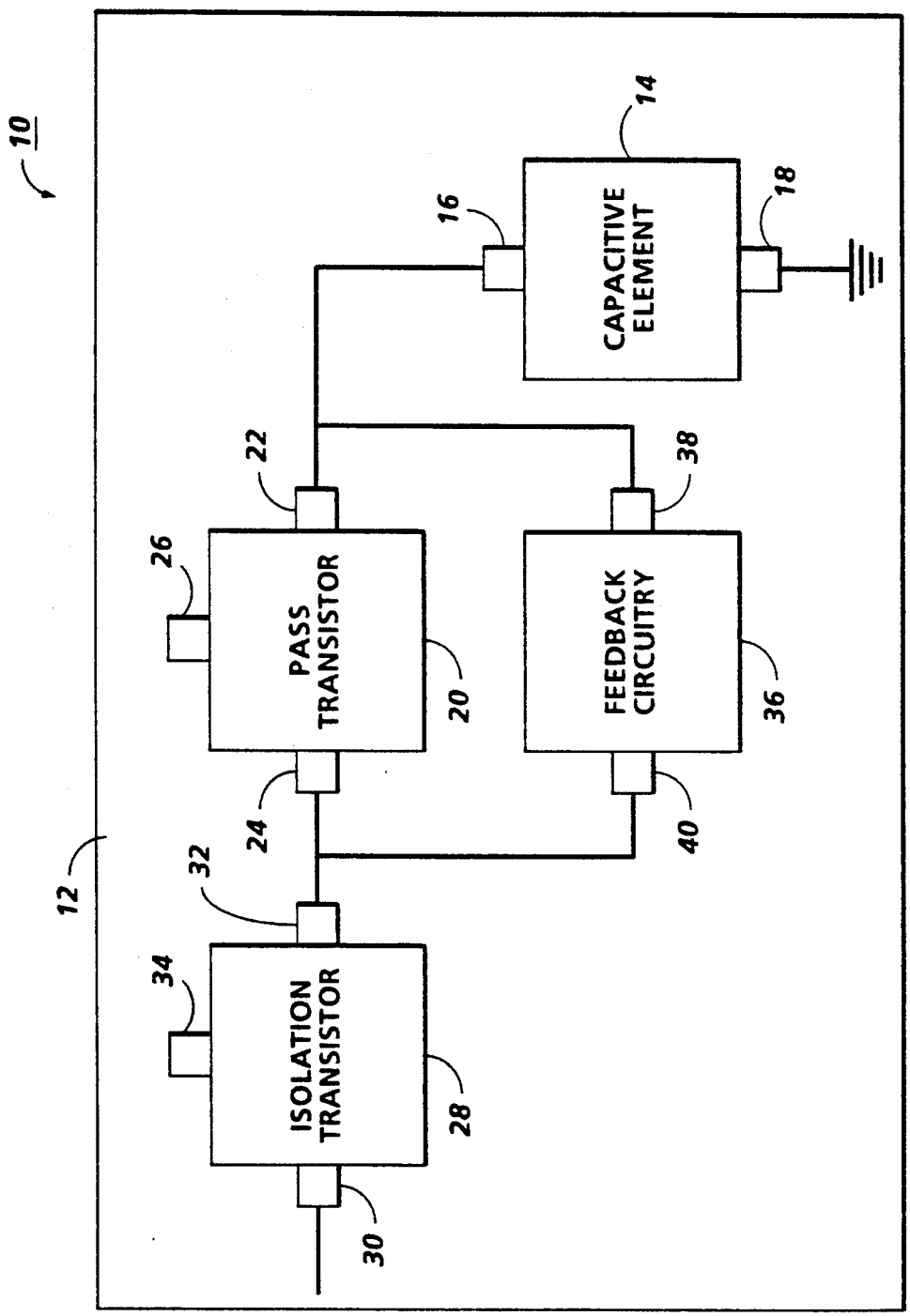
FIG. 1 is a schematic block diagram showing basic components of an integrated circuit according to the invention.
Figure 2:
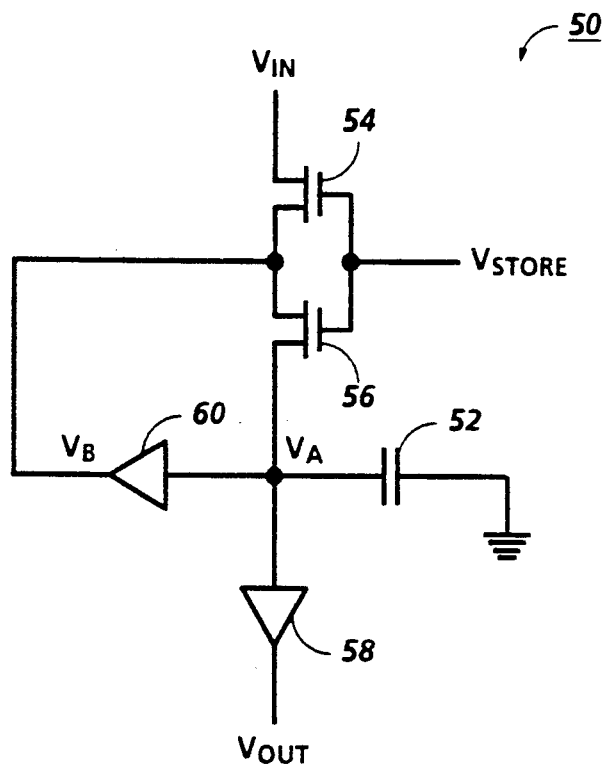
FIG. 2 is an electrical circuit diagram of a circuit implementing the components of FIG. 1.

FIGS. 1 and 2 illustrate general features of the invention. FIG. 1 is a schematic block diagram showing general functional components of an integrated circuit according to the invention. FIG. 2 is an electrical circuit diagram of a circuit implementing the components of FIG. 1.

Integrated circuit 10 in FIG. 1 includes substrate 12, on which are formed several components. Capacitive element 14 has charging lead 16 through which it can be charged and ground lead 18 at ground potential. Pass transistor 20 has output lead 22, one of its channel leads, connected to charging lead 16; intermediate lead 24, the other of its channel leads, connected to receive an input signal; and gate lead 26 connected to receive a signal controlling the impedance of its channel. Isolation transistor 28 has input lead 30, one of its channel leads, connected for receiving a voltage toward which capacitive element 14 is to be charged; intermediate lead 32, the other of its channel leads, connected to or the same as intermediate lead 24 of pass transistor 20; and gate lead 34 connected to receive a signal controlling the impedance of its channel. Feedback circuitry 36 has leads 38 and 40 connected respectively to output lead 22 and intermediate lead 24 of pass transistor 20.

As can be seen from FIG. 1, if the only significant leakage path to and from capacitive element 14 is through the channel of pass transistor 20, then feedback circuitry 36 can greatly lengthen the storage time of capacitive element 14 by preventing leakage. Any other leakage paths can be substantially eliminated if substrate 12 is an insulating substrate such as glass, quartz, silicon dioxide, silicon nitride, or sapphire, with capacitive element 14, transistors 20 and 28, and feedback circuitry 36 being, for example, thin film structures.

Circuit 50 in FIG. 2 includes capacitor 52, which functions as a capacitive element that stores a voltage level. The remainder of the circuitry in circuit 50 serves several functions: Input transistors 54 and 56 together provide a channel to an external input connection through which current can flow to modify the stored voltage level. Output buffer 58 provides an output signal indicating the stored voltage level. Feedback buffer 60 duplicates the stored voltage level in a manner which assists in retaining the voltage level as described in greater detail below.

In circuit 50, the primary current path to capacitor 52 is through transistors 54 and 56. The input channel lead of transistor 54 is connected to receive input signal $V_{IN}$. The output channel lead of transistor 54 is connected to the input channel lead of transistor 56. The output channel lead of transistor 56 is connected to the lead through which capacitor 52 is charged, completing the primary current path to capacitor 52.

The flow of current in this primary current path is controlled to an extent by $V_{STORE}$, connected to the gate leads of transistors 54 and 56. $V_{STORE}$ provides a store pulse during an interval over which capacitor 52 is charged to the voltage level to be stored, which may depend on $V_{IN}$ or on the length of the store pulse from $V_{STORE}$. During the store pulse, transistors 54 and 56 function as pass transistors, permitting current to flow through their channel. When the pulse ends, transistors 54 and 56 go to their high impedance, or off, state.

While transistors 54 and 56 are off, capacitor 52 stores the voltage level $V_A$. The charging lead of capacitor 52 is also connected to output buffer 58, to provide output signal $V_{OUT}$ indicating the stored voltage level $V_A$. Output buffer 58 can be a unity gain MOS voltage buffer with high impedance and negligible leakage.

When transistors 54 and 56 are in their high impedance, or off, state, some leakage current can flow if $V_{IN}$ and $V_A$ are not equal, shortening the storage time of capacitor 52. The only significant charge leakage path in transistor 56 is between its channel leads. The leakage currents to the gate lead and to the substrate are negligible if transistor 56 is an MOS thin film transistor on an insulating substrate. Feedback buffer 60 operates to actively prevent leakage current through the channel of transistor 56.

Feedback buffer 60 functions as a voltage follower with approximately zero offset. With proper biasing, the potential difference between the channel leads of transistor 56 is approximately zero, with $V_B$ approximately equal to $V_A$, and almost no leakage current can flow through its channel. If $V_{IN}$ changes from its value during the store pulse, a bias appears across the channel leads of transistor 54, so that leakage currents will flow through it, but these currents flow through feedback buffer 60 to other connections, and do not affect the stored voltage level in capacitor 52. Futhermore, transistor 54 serves as an isolating transistor, isolating $V_B$ from the fluctuations of $V_{IN}$ while transistors 54 and 56 are in the off state so that current demands on feedback buffer 60 are reduced and so that feedback buffer 60 can function effectively to keep $V_B$ approximately constant.

C. Feedback Buffer Circuits

Figure 3:
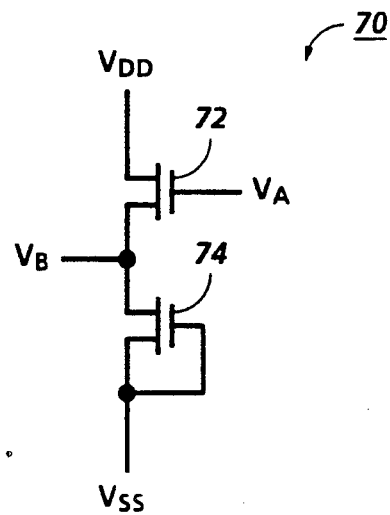
FIG. 3 is a circuit diagram of a source follower circuit that can be used as the feedback buffer in FIG. 2.
Figure 4:
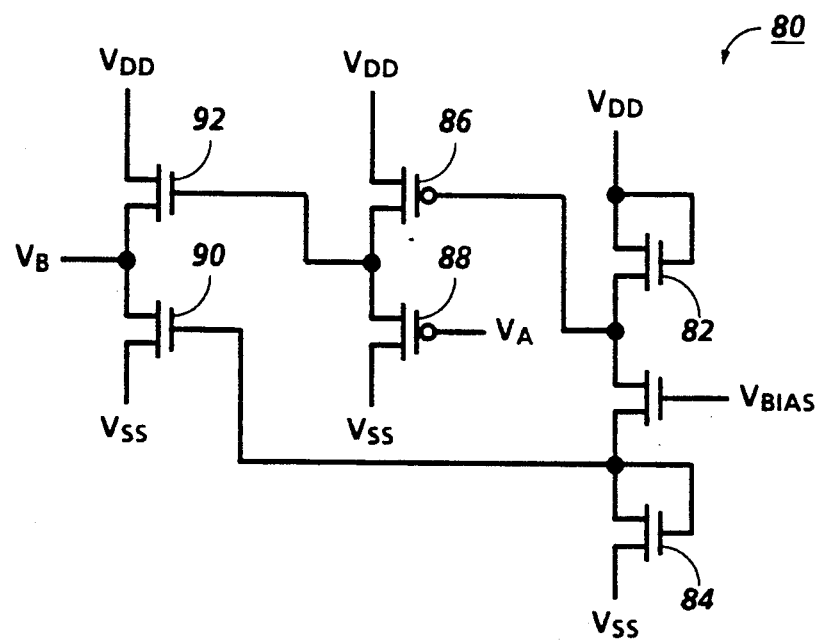
FIG. 4 is a circuit diagram of a double source follower circuit that can be used as the feedback buffer in FIG. 2.
Figure 5:
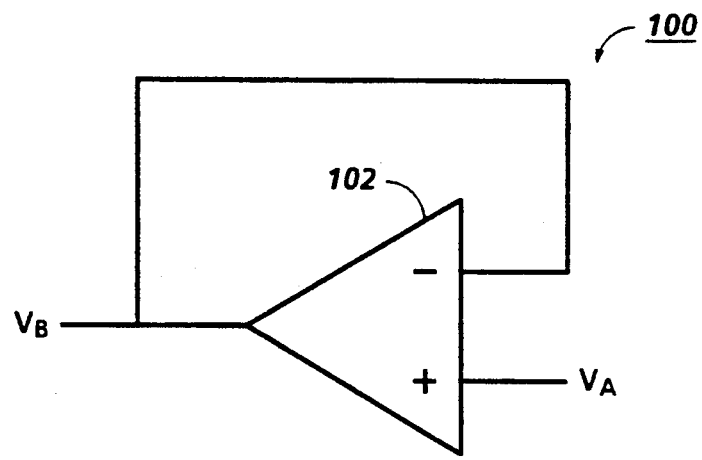
FIG. 5 is a circuit diagram of a circuit with an operational amplifier that can be used as the feedback buffer in FIG. 2.

Feedback buffer 60 in FIG. 2 could be implemented in many ways. FIG. 3 illustrates a zero-offset source follower circuit. FIG. 4 illustrates a double source follower circuit. FIG. 5 illustrates a circuit that includes an operational amplifier configured as a voltage follower.

Follower circuit 70 in FIG. 3 includes transistors 72 and 74. The source of transistor 72 and the drain of transistor 74 are connected to $V_B$, at the input lead of transistor 56, and the gate of transistor 72 is connected to $V_A$, at the output lead of transistor 56. The gate and source of transistor 74 are both connected to $V_{SS}$, which can be at ground. Transistor 74 therefore forms a load that draws a current as long as $V_B$ is not equal to $V_{SS}$.

To ensure that no current passes to or from the capacitive element through follower circuit 70, transistor 72 is a device that does not permit current flow between its gate lead and its channel. Transistor 72 could be an MOS device or other insulated gate transistor, for example.

Transistor 72 is connected as a source follower; under quiescent conditions, it passes the same current as transistor 74, and is therefore self-biased to a gate-source voltage of zero. Therefore, the voltage offset ($V_B - V_A$) across transistor 56 is very close to zero. The finite output impedance of the transistors in saturation will cause a small offset for output voltages other than $\frac{1}{2}(V_{DD} + V_{SS})$, but this effect is likely to be small, particularly if long channel transistors are used.

To obtain approximately zero offset, transistors 72 and 74 must be identical. In addition, in order to keep $V_B$ approximately constant, transistors 72 and 74 must be of sufficient size that their quiescent current is much larger than the leakage current in transistor 54. When the voltage across transistor 54 results in leakage current, that current flows either through transistor 72 or through transistor 74, depending on its polarity. As a result, $V_B$ is held approximately constant, once established.

Transistors 72 and 74 must also be structured so that their quiescent current is smaller than the charging current available when transistors 54 and 56 are in their low impedance, or on, state. During charging, some of the current flowing through transistor 54 flows to the voltage follower rather than through transistor 56 to capacitor 52. If this current is too large, the required charging time increases. As $V_A$ approaches $V_{IN}$, $V_{IN} - V_B$ must decrease, however, so that the current flowing from transistor 54 to the voltage follower decreases, and eventually approaches zero when $V_B = V_A = V_{IN}$, the fully charged condition of capacitor 52.

In double source follower circuit 80 in FIG. 4, transistors 82 and 84 are identical. Transistors 86 and 88 are identical pMOS devices, and transistors 90 and 92 are identical nMOS devices.

Circuit 80 operates as follows: Transistors 82 and 84 pass identical currents, and, because they are identical, have equal gate-to-source voltages. As a result, transistors 86 and 90 have equal but opposite gate-to-source voltages, which in turn causes transistors 88 and 92 to have equal but opposite gate-to-source voltages. Therefore, the net offset, the difference $V_A - V_B$, is approximately zero.

Follower circuit 100 in FIG. 5 includes operational amplifier 102 with its positive input lead connected to $V_A$ and its negative input lead and output lead connected to $V_B$ so that it maintains $V_A = V_B$. Various operational amplifier circuits could be used in this implementation.

D. An Implementation

Figure 6:
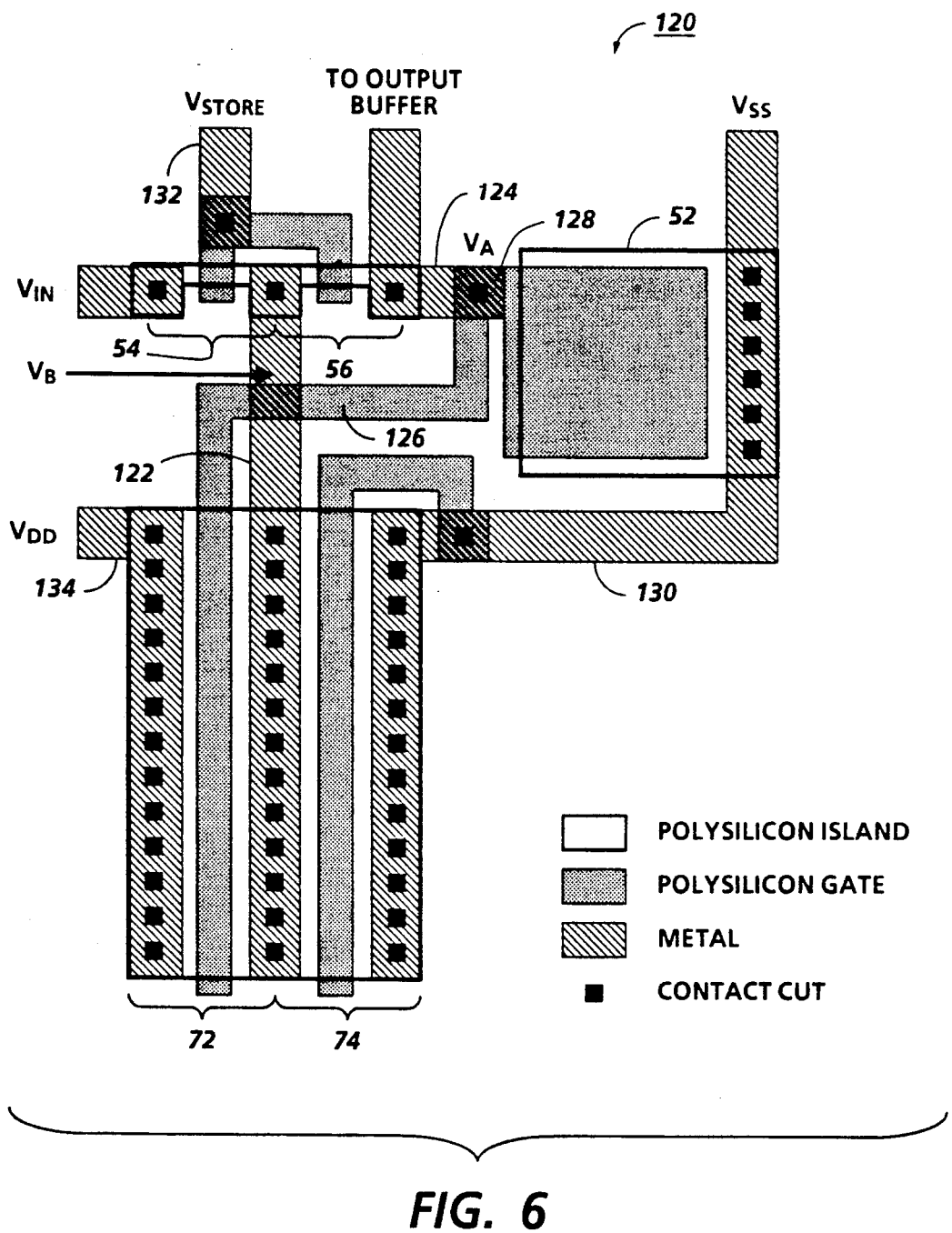
FIG. 6 is an integrated circuit layout diagram for an implementation of the circuit of FIG. 2 with the source follower circuit of FIG. 3.

The invention has been implemented with a circuit layout as shown in FIG. 6. The layout of FIG. 6 implements follower circuit 70 in FIG. 3 in circuit 50 in FIG. 2, and the reference numerals in FIG. 6 are the same as those of equivalent components shown in FIGS. 2 and 3.

In circuit layout 120, line 122 connects the shared lead of transistors 54 and 56 to the shared lead of transistors 72 and 74. Lines 124 and 126 connect lead 128, through which capacitor 52 is charged, to one channel lead of transistor 56 and to the gate lead of transistor 72, respectively. Line 130 connects the gate lead and one channel lead of transistor 74 to ground. Line 132 connects the gate leads of transistors 54 and 56 to $V_{STORE}$. Line 134 connects one channel lead of transistor 72 to $V_{DD}$. As shown, transistors 72 and 74 have the same characteristics as transistors 54 and 56 but are much wider.

The implementation described above could be modified in a number of ways. For example, transistors 72 and 74 might be depletion devices to avoid the need to make them wider than transistors 54 and 56. Thin film structures might be used to form n- or p-channel devices; or n- or p-channel single crystal silicon-on-insulator devices might be used, such as silicon-on-sapphire.

Output buffer 58 in FIG. 2 might be implemented with another voltage follower, or might be eliminated altogether by taking the output directly from $V_B$, further reducing potential leakage from capacitor 52.

E. Miscellaneous

A sample and hold circuit according to the invention would have many applications. For example, it could be used in a scanning array or in a printing array, to store an analogue value for longer than would be possible with previous techniques. In general, a sample and hold circuit according to the invention could be used to avoid converting analogue signals to digital form for storage.

Although the invention has been described in relation to various implementations, together with modifications, variations and extensions thereof, other implementations, modifications, variations and extensions are within the scope of the invention. The invention is therefore not limited by the description contained herein or by the drawings, but only by the claims.

What is claimed:

1. An integrated circuit comprising:
   a substrate; and
   circuitry on the substrate, the circuitry comprising:
   a capacitive element having a charging lead and a fixed potential lead, the fixed potential lead being at a fixed potential;
   input circuitry having a first channel that is switchable between high impedance and low impedance, a first channel input lead, and a first channel output lead; the first channel extending between and connecting to the first channel input lead and the first channel output lead; the first channel output lead being connected to the charging lead of the capacitive element;

isolation circuitry having an isolation output lead connected to the first channel input lead and an isolation input lead connected to receive an input voltage signal; the isolation circuitry being switchable between high impedance and low impedance so that the capacitive element can be charged to a voltage level when the first channel and isolation circuitry are at low impedance and can store the voltage level when the first channel and isolation circuitry are at high impedance; and feedback circuitry having a first feedback lead connected to the first channel output lead and having a second feedback lead directly connected without any intervening elements to the first channel input lead, the feedback circuitry not passing current to or from the capacitive element, the feedback circuitry maintaining approximately zero voltage difference between the first and second feedback leads in order to maintain approximately zero leakage current flow through the first channel when the first channel and isolation circuitry are at high impedance.

2. The integrated circuit of claim 1 in which the isolation circuitry comprises a second channel switchable between high impedance and low impedance, a second channel input lead and a second channel output lead; the second channel extending between and connecting to the second channel input lead and the second channel output lead; the second channel output lead being connected through the isolation output lead to the first channel input lead; the second channel input lead being connected through the isolation input lead for receiving the input voltage signal.

3. The integrated circuit of claim 2 in which the input circuitry includes a first input transistor and the isolation circuitry includes a second input transistor, the first input transistor including the first channel, the second input transistor including the second channel.

4. The integrated circuit of claim 2 in which the input circuitry further comprises a first channel gate lead for receiving a signal switching the first channel between low and high impedance and the isolation circuitry further comprises a second channel gate lead for receiving a signal switching the second channel between low and high impedance.

5. The integrated circuit of claim 4 in which the first and second channel gate leads are both connected for receiving a store signal, the store signal switching both of the first and second channels between low and high impedance.

6. The integrated circuit of claim 1 in which the feedback circuitry comprises a follower transistor having a first follower channel lead, a second follower channel lead, and a follower gate lead; the follower gate lead being connected through the first feedback lead to the first channel output lead; the first follower channel lead being connected through the second feedback lead to the first channel input lead; the second follower channel lead being connected to a follower bias voltage;

the feedback circuitry further comprising load circuitry connected to the first follower channel lead for maintaining a follower current flow through the follower transistor; the follower current flow being sufficiently great to be much larger than any leakage current through the isolation circuitry when the isolation circuitry is at high impedance and sufficiently small that the input voltage signal can charge the capacitive element to the voltage level when the isolation circuitry and the first channel are at low impedance; the follower bias voltage and the follower current flow being such that the follower gate lead and the first follower channel lead are both at the stored voltage level when the isolation circuitry and the first channel are at high impedance.

7. The integrated circuit of claim 6 in which the load circuitry comprises a load transistor having a first load channel lead, a second load channel lead, and a load gate lead; the first load channel lead being connected to the first follower channel lead; the load gate lead and the second load channel lead each being connected to a respective bias voltage such that the follower current flow is sufficient that the follower gate lead and the first follower channel lead are both at the stored voltage level when the isolation circuitry and the first channel are at high impedance.

8. The integrated circuit of claim 7 in which the follower transistor and the load transistor are identical and the respective bias voltages of the load gate lead and the second load channel lead are the same.

9. The integrated circuit of claim 6 in which the substrate is an insulating substrate.

10. The integrated circuit of claim 9 in which the substrate is glass, quartz, sapphire, silicon dioxide, or silicon nitride.

11. The integrated circuit of claim 10 in which the capacitive element, the input circuitry, the isolation circuitry, and the feedback circuitry are thin film structures.

12. The integrated circuit of claim 6 in which the follower transistor is an insulated gate transistor.

13. The integrated circuit of claim 1 in which the substrate is an insulating substrate.

14. The integrated circuit of claim 13 in which the substrate is glass, quartz, sapphire, silicon dioxide, or silicon nitride.

15. The integrated circuit of claim 14 in which the capacitive element, the input circuitry, the isolation circuitry, and the feedback circuitry are thin film structures.

16. A circuit comprising:
a capacitive element having a charging lead and a fixed potential lead, the fixed potential lead being at a fixed potential;
input circuitry comprising a first channel that is switchable between high impedance and low impedance, a first channel input lead, and a first channel output lead; the first channel extending between and connecting to the first channel input lead and the first channel output lead; the first channel output lead being connected to the charging lead of the capacitive element;
isolation circuitry having an isolation output lead connected to the first channel input lead and an isolation input lead connected to receive an input voltage signal, the isolation circuitry being switchable between high impedance and low impedance so that the capacitive element can be charged to a voltage level by the input voltage signal when the first channel and the isolation circuitry are at low impedance and can store the voltage level when the first channel and the isolation circuitry are at high impedance; and feedback circuitry comprising:

a follower transistor having a first follower channel lead, a second follower channel lead, and a follower gate lead; the follower gate lead being connected to the first channel output lead; the first follower channel lead being directly connected without any intervening elements to the first channel input lead; the second follower channel lead being connected to a follower bias voltage; and load circuitry connected to the first follower channel lead for maintaining a follower current flow through the follower transistor; the follower current flow being sufficiently great to be much larger than any leakage current through the isolation circuitry when the isolation circuitry is at high impedance and sufficiently small that the input voltage signal can charge the capacitive element to the voltage level when the isolation circuitry and the first channel are at low impedance; the follower bias voltage and the follower current flow being such that the follower gate lead and the first follower channel lead are both at the stored voltage level when the isolation circuitry and the first channel are at high impedance;

the feedback circuitry not passing current to or from the capacitive element, the feedback circuitry maintaining approximately zero voltage difference between the first channel input and output leads in order to maintain approximately zero leakage current flow through the first channel when the first channel is at high impedance.

17. The circuit of claim 16 in which the load circuitry comprises a load transistor having a first load channel lead, a second load channel lead, and a load gate lead; the first load channel lead being connected to the first follower channel lead; the load gate lead and the second load channel lead each being connected to a respective bias voltage such that the follower current flow is sufficient that the follower gate lead and the first follower channel lead are both at the stored voltage level when the isolation circuitry and the first channel are at high impedance.

18. The integrated circuit of claim 16 in which the follower transistor and the load transistor are identical and the respective bias voltages of the load gate lead and the second load channel are the same.

19. An integrated circuit comprising:

a substrate; the substrate being an insulating substrate with a surface; and circuitry on the substrate, the circuitry being a thin film structure formed by deposition of films on the surface of the substrate so that no significant leakage current can flow from the circuitry into the substrate; the circuitry comprising:

a capacitive element having a charging lead and a fixed potential lead, the fixed potential lead being at a fixed potential;

input circuitry having a first channel that is switchable between high impedance and low impedance, a first channel input lead, and a first channel output lead; the first channel extending between and connecting to the first channel input lead and the first channel output lead so that current can flow between the first channel input lead and the first channel output lead along the first channel; the first channel output lead being connected to the charging lead of the capacitive element; the input circuitry further comprising a first channel gate lead for receiving a signal switching the first channel between high impedance and low impedance, the first channel gate lead being separated from the first channel by an insulator so that no significant leakage current can flow between the first channel and the first channel gate lead;

isolation circuitry having an isolation output lead connected to the first channel input lead and an isolation input lead connected to receive an input voltage signal; the isolation circuitry being switchable between high impedance and low impedance so that the capacitive element can be charged to a voltage level when the first channel and isolation circuitry are at low impedance and can store the voltage level when the first channel and isolation circuitry are at high impedance; and feedback circuitry having a first feedback lead connected to the first channel output lead and having a second feedback lead directly connected without any intervening elements to the first channel input lead, the feedback circuitry not passing current to or from the capacitive element so that significant leakage current can only flow between the first channel input lead and the first channel output lead along the first channel, the feedback circuitry maintaining approximately zero voltage difference between the first and second feedback leads in order to maintain approximately zero leakage current flow through the first channel when the first channel and isolation circuitry are at high impedance.

20. An integrated circuit comprising:

a substrate; the substrate being an insulating substrate with a surface; and circuitry on the substrate, the circuitry being a thin film structure formed by deposition of films on the surface of the substrate so that no significant leakage current can flow from the circuitry into the substrate; the circuitry comprising:

a capacitive element having a charging lead and a fixed potential lead, the fixed potential lead being at a fixed potential;

input circuitry comprising a first channel that is switchable between high impedance and low impedance, a first channel input lead, and a first channel output lead; the first channel extending between and connecting to the first channel input lead and the first channel output lead so that current can flow between the first channel input lead and the first channel output lead along the first channel; the first channel output lead being connected to the charging lead of the capacitive element; the input circuitry further comprising a first channel gate lead for receiving a signal switching the first channel between high impedance and low impedance, the first channel gate lead being separated from the first channel by an insulator so that no significant leakage current can flow between the first channel and the first channel gate lead;

isolation circuitry having an isolation output lead connected to the first channel input lead and an isolation input lead connected to receive an input voltage signal, the isolation circuitry being switchable between high impedance and low impedance so that the capacitive element can be charged to a voltage level by the input voltage signal when the first channel and the isolation circuitry are at low impedance and can store the voltage level when the first channel and the isolation circuitry are at high impedance; and feedback circuitry comprising:
 a follower transistor having a first follower channel lead, a second follower channel lead, and a follower gate lead; the follower gate lead being connected to the first channel output lead; the first follower channel lead being directly connected without any intervening elements to the first channel input lead; the second follower channel lead being connected to a follower bias voltage; and
 load circuitry connected to the first follower channel lead for maintaining a follower current flow through the follower transistor; the follower current flow being sufficiently great to be much larger than any leakage current through the isolation circuitry when the isolation circuitry is at high impedance and sufficiently small that the input voltage signal can charge the capacitive element to the voltage level when the isolation circuitry and the first channel are at low impedance; the follower bias voltage and the follower current flow being such that the follower gate lead and the first follower channel lead are both at the stored voltage level when the isolation circuitry and the first channel are at high impedance;

the feedback circuitry not passing current to or from the capacitive element so that significant leakage current can only flow between the first channel input lead and the first channel output lead along the first channel, the feedback circuitry maintaining approximately zero voltage difference between the first channel input and output leads in order to maintain approximately zero leakage current flow through the first channel when the first channel is at high impedance.

* * * * *